United States Patent [19]

Chin et al.

[11] Patent Number: 4,977,295
[45] Date of Patent: Dec. 11, 1990

[54] GASKET IMPERVIOUS TO ELECTROMAGNETIC ENERGY

[75] Inventors: Tim Chin, Norwood; Susan D. Kohlman, Ayer, both of Mass.

[73] Assignee: Raytheon Company, Lexington, Mass.

[21] Appl. No.: 386,059

[22] Filed: Jul. 28, 1989

[51] Int. Cl.$^5$ ............................................. H05K 9/00
[52] U.S. Cl. ............................ 174/35 GC; 174/35 MS
[58] Field of Search .......... 174/35 GC, 35 MS, 35 R; 219/10.55 R, 10.55 D; 361/424; 277/227, 228, 235 R, 235 A, 235 B

[56] References Cited

U.S. PATENT DOCUMENTS

| | | | |
|---|---|---|---|
| 4,020,233 | 4/1977 | Morgan | 428/419 |
| 4,048,218 | 9/1977 | Morgan et al. | 560/147 |
| 4,352,723 | 10/1982 | Morgan | 204/159.19 |
| 4,857,668 | 8/1989 | Buonanno | 174/35 GC |

Primary Examiner—Leo P. Picard
Assistant Examiner—Bot L. Ledynh
Attorney, Agent, or Firm—Donald F. Mofford; Richard M. Sharkansky

[57] ABSTRACT

A gasket, and method of making same, is shown to consist of a substantially solid core of silicone rubber supporting an electrically conductive coating primarily made from a polythioether impregnated with particles of nickel, the coating also containing an oxidizing inhibitor.

7 Claims, 1 Drawing Sheet

GASKET IMPERVIOUS TO ELECTROMAGNETIC ENERGY

This invention was made with Government support under Contract No. FO8635-87-C-0065 awarded by the Department of the Air Force.

BACKGROUND OF THE INVENTION

This invention pertains generally to apparatus for shielding radio frequency energy, and particularly to compliant gaskets for such purpose.

It has been known in the art for many years that shielding of many types of apparatus from the effects of electromagnetic energy may be required. For example, it is known that cables interconnecting units in a radar receiver and processor, as well as such units themselves, should be shielded from stray electromagnetic energy (sometimes referred to as electromagnetic interference, EMI, or radio frequency interference, RFI).

To effect desired shielding in a monostatic radar it is common practice to dispose elements desired to be shielded (such as a radar receiver) in a metallic enclosure or to sheath interconnecting cables in a metallic covering, for example, a metallic covering consisting of braided strands of Monel metal. In either case the shielding enclosure or metallic covering is grounded so that electric charges due to EMI or RFI are dissipated before penetrating such enclosure or covering. In the case of a transportable metallic enclosure fabricated of formed metallic panels that are bolted together, all interstices between such panels must be rendered impervious to EMI or RFI. One convenient way to accomplish such end is to install an electrically conductive gasket (hereinafter simply referred to as a gasket) so as to fill any possible interstice. A moment's thought will make it clear that a satisfactory gasket would be made from a material, or materials, that are: (a) chemically stable, meaning that there be no appreciable galvanic action between the material of the gasket and any abutting metallic panel, but rather that the electrical resistance across all interfaces between gasket and panel always be low; (b) mechanically stable, meaning that a gasket be resilient to some degree even after a long period of time during which the gasket may be subjected to a corrosive atmosphere and elevated ambient temperatures that may adversely affect resiliency of many materials; and (c) electrically conductive, meaning that the effectiveness, i.e., degree of shielding, be independent of the frequency of any EMI or RFI. In addition to the foregoing, a satisfactory material, or materials, for a gasket should have finishing qualities compatible with the finishing qualities of the metallic panels. It will be evident that the characteristics of material, or materials, for a gasket used with interconnecting cables are the same as the characteristics listed above. Unfortunately, however, there is no known material, or combination of materials, that possess all of the required and desired characteristics for a satisfactory gasket.

SUMMARY OF THE INVENTION

With the foregoing background of this invention in mind, it is a primary object of this invention to provide a gasket for use in shielding electrical components from EMI or RFI, the materials of such gasket being selected to produce a gasket with satisfactory mechanical, chemical and electrical properties.

Another object of this invention is to produce a gasket as set forth as the primary object of this invention, the exposed surface of such gasket having finishing qualities compatible with the finishing qualities of adjoining elements of an enclosure or cable.

Still another object of this invention is to provide a method of fabricating a gasket that fulfills the objects set forth above.

The foregoing and other objects of this invention may be attained generally by: (a) a gasket comprising a core (preferably of silicone rubber) with a coating of a polythioether impregnated with particles of nickel, such coating also containing an oxidizing inhibitor; and (b) a method of applying a coating made from a polythioether impregnated with particles of nickel and containing an oxidizing inhibitor to a core of silicone rubber. "Polythioether" here is meant to refer to compound analogous to an alcohol, characterized by the substitution of sulfur for oxygen in the OH radical and sometimes referred to as a mercaptan. "Prepared Polythioether" is a polythioether with added materials, as described hereinafter.

BRIEF DESCRIPTION OF THE DRAWINGS

For a more complete understanding of this invention, reference is now made to the following description of preferred embodiments of this invention as illustrated in the accompanying drawings wherein.

DESCRIPTION OF THE PREFERRED EMBODIMENTS

Figure 1:
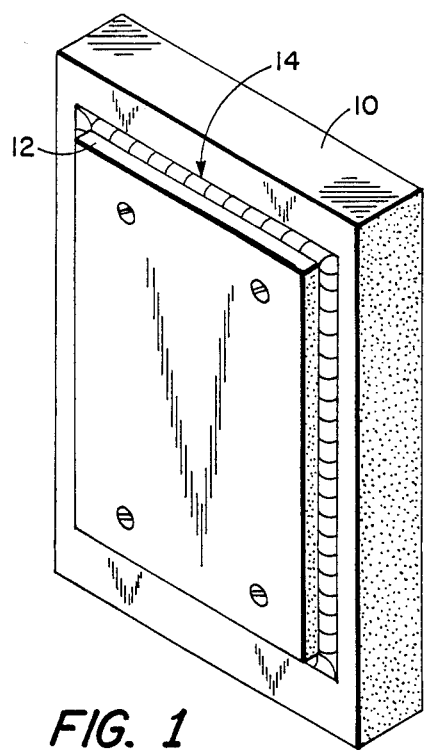
FIG. 1 is a sketch showing a gasket according to this invention in place to fill any interstice between panels exemplary of panels used in forming an enclosure.
Figure 2:
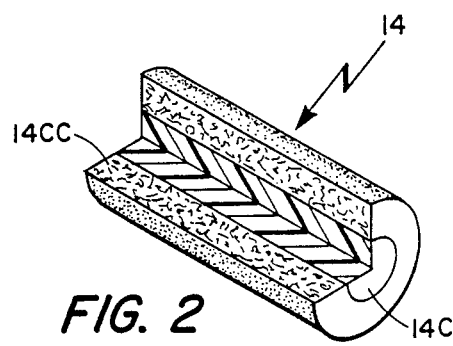
FIG. 2 is a quarter section of a section of a gasket such as that shown in FIG. 1.

Referring now to FIG. 1, a plate 10 (corresponding to a first metallic panel with an opening, not numbered, formed as shown) supports a cover plate 12 (corresponding to a second metallic panel) in any convenient manner (as by screws, not numbered, interconnecting the plate 10 and the cover plate 12). A gasket 14 (constructed as shown in FIG. 2) is disposed as shown to cover any interstice between the plate 10 and the cover plate 12. It should be noted that: (a) either the plate 10 or the cover plate 12 (or both elements) may be machined to provide a groove in which the gasket 14 may be more securely positioned; or (b) straps may be provided to secure the gasket 14. In any event, the interstice between the plate 10 and the cover plate 14 is completely filled (meaning that there is no opening between the plate 10 and the cover plate 12 for EMI or RFI) even though the spacing between the plate 10 and the cover plate 14 may vary.

Referring now to FIG. 2, it may be seen that the gasket 14 has a core 14c with a coating 14cc. Here the core 14c preferably is a filamentary structure made from silicone rubber in a manner to be described. The coating 14cc is a cured resin (impregnated with particles of nickel and containing an oxidizing inhibitor) covering the core 14c in a manner to be described. Preferably the cured resin is the polythioether known as PR 1764 manufactured by Products Research and Chemical Corporation. The oxidizing inhibitor preferably is a metallic chromate, as for example aluminum chromate.

Figure 3:
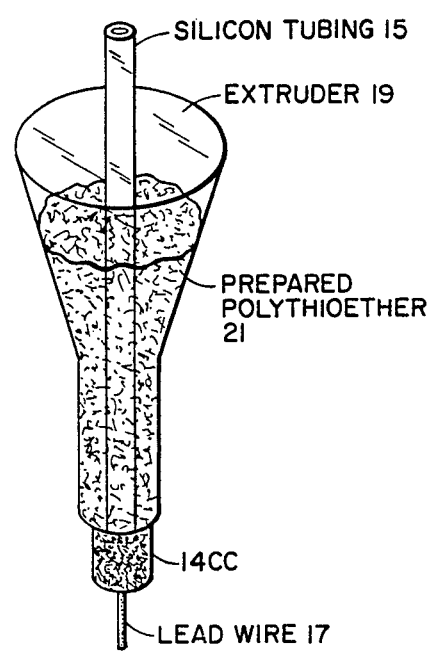
FIG. 3 is a sketch of apparatus used in the method contemplated by this invention.
Figure 4:
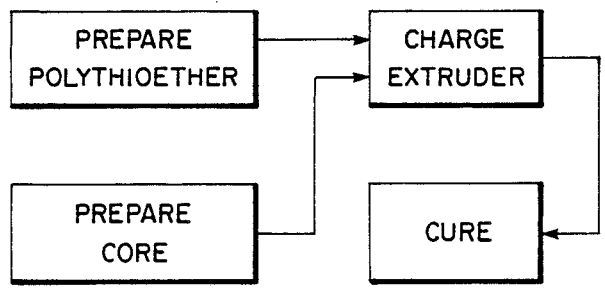
FIG. 4 is a flow chart of the steps of the contemplated method.

Referring now to FIGS. 3 and 4, the method here contemplated is shown. Thus, a length of tubing 15 made from silicone rubber is prepared for processing by fitting a lead wire 17 into such length of tubing. The polythioether is prepared for use by thoroughly mixing 10 parts by weight of a base with one part of an accelerator. An extruder 19 is charged with the so-prepared polythioether 21. The lead wire 17 and the silicone tubing 15 are passed through the extruder 19 in any convenient manner so that a substantially even and continuous coating of prepared polythioether 21 adheres to the outside of the silicone tubing 15 to produce an intermediate form (not numbered) of the gasket 14 (FIG. 1). The intermediate form of the gasket 14 (FIG. 1) is then placed in an appropriately dimensioned mold and allowed to cure at ambient temperature for, say, twenty-four hours. The mold here may be made up of two matching sections, each one of such sections having a half groove, so that the silicone tubing 15 in the intermediate form of the gasket 14 (FIG. 1) is converted during curing to the substantially solid core shown in FIG. 2.

Having described a preferred apparatus and method according to this invention, it will now be apparent that changes may be made without departing from our inventive concepts. Thus, so long as a material that retains its resiliency is used, along with a polythioether loaded with nickel particles and an oxidizing inhibitor, changes may be made. For example, the gasket need not be formed as an extruded filamentary structure, but rather could be formed as a flat structure for installation with coaxial cables or between flanges of waveguides. It is felt, therefore, that this invention should not be restricted to its disclosed embodiment, but rather should be limited only by the spirit and scope of the appended claims.

What is claimed is:

1. A gasket for sealing interstices between electrically conductive elements comprising:
   (a) a core comprising a resilient material; and
   (b) a coating overlying the core, said coating comprising a polythioether impregnated with particles of an electrically conductive material to render the coating electrically conductive.

2. The gasket as recited in claim 1 wherein the coating further comprises an oxidizing inhibitor.

3. The gasket as recited in claim 2 wherein the material of the core is silicone rubber.

4. The gasket as recited in claim 3 wherein the electrically conductive material is nickel.

5. The gasket as in recited claim 4 wherein the oxidizing inhibitor is a metallic chromate.

6. A gasket comprising:
   means for sealing interstices between electrically conductive elements mated together for impeding electromagnetic energy from propagating through said interstices, said means for sealing comprising:
   (a) a core of a resilient material; and
   (b) a coating disposed about the core, said coating comprising:
      (i) a cured resin being a polythioether properties;
      (ii) particles of an electrically conductive material impregnated in said cured resin; and
      (iii) a metallic chromate type interspersed in the coating.

7. The gasket as recited in claim 6 wherein the cured resin and the particles of an electrically conductive material impregnated in said cured resin is a nickel filled polythioether known as PR1764 and the metallic chromate type is aluminum chromate.

* * * * *